United States Patent
Harada et al.

(10) Patent No.: US 6,198,362 B1
(45) Date of Patent: Mar. 6, 2001

(54) PRINTED CIRCUIT BOARD WITH CAPACITORS CONNECTED BETWEEN GROUND LAYER AND POWER LAYER PATTERNS

(75) Inventors: Takashi Harada; Hideki Sasaki, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/264,824

(22) Filed: Mar. 9, 1999

(30) Foreign Application Priority Data

Mar. 16, 1998 (JP) .................................................. 10-065278

(51) Int. Cl.[7] ...................................................... H05K 7/02
(52) U.S. Cl. ........................... 333/12; 333/22 R; 361/794; 361/818
(58) Field of Search .................................... 333/12, 22 R; 361/766, 780, 794, 818

(56) References Cited

U.S. PATENT DOCUMENTS

| 4,875,457 | * | 10/1989 | Fitzner | ............................... | 333/12 X |
| 5,041,945 | * | 8/1991 | Suzuki | ................................. | 361/818 |
| 5,708,400 | | 1/1998 | Morris | .................................... | 333/12 |
| 5,926,377 | * | 7/1999 | Nakao et al. | ...................... | 333/12 X |
| 5,966,294 | * | 10/1999 | Harada et al. | ....................... | 361/794 |

FOREIGN PATENT DOCUMENTS

| 61-6846 | 1/1986 | (JP) . |
| 6-82803 | 3/1994 | (JP) . |
| 9-191184 | 7/1997 | (JP) . |
| 9-266361 | 10/1997 | (JP) . |
| 9-283974 | 10/1997 | (JP) . |

\* cited by examiner

Primary Examiner—Justin P. Bettendorf
(74) Attorney, Agent, or Firm—Young & Thompson

(57) ABSTRACT

A printed circuit board is disclosed. A top layer power supply pattern and a top layer ground pattern are formed. The top layer power supply pattern and the top layer ground pattern are connected to a power supply layer and a ground layer through a plurality of viaholes, respectively. A plurality of capacitors or a plurality of capacitor resistor series circuits are disposed at predetermined intervals between the top layer power supply pattern and the top layer ground pattern.

19 Claims, 11 Drawing Sheets

F I G. 12
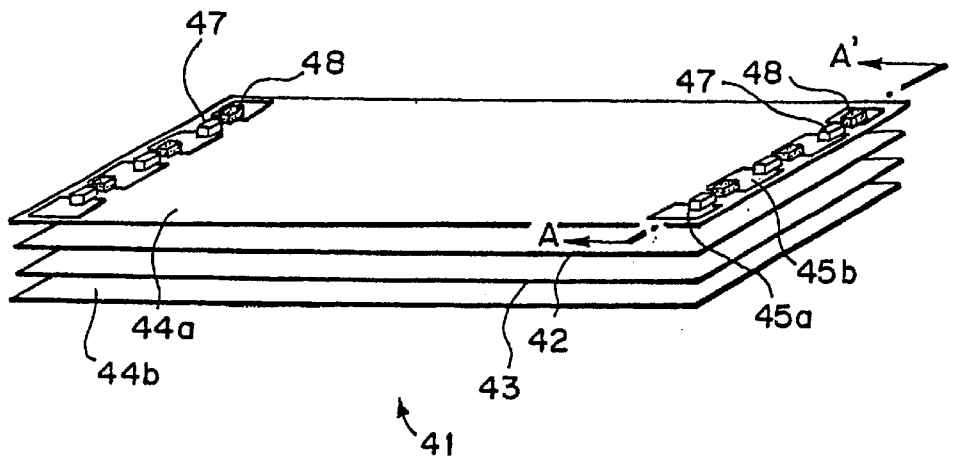
F I G. 13
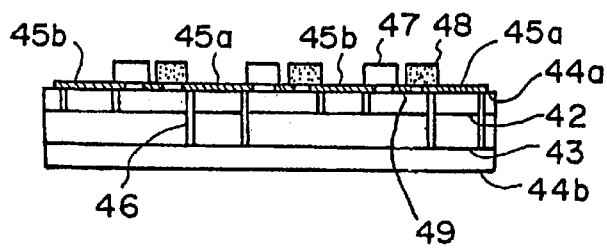
F I G. 14
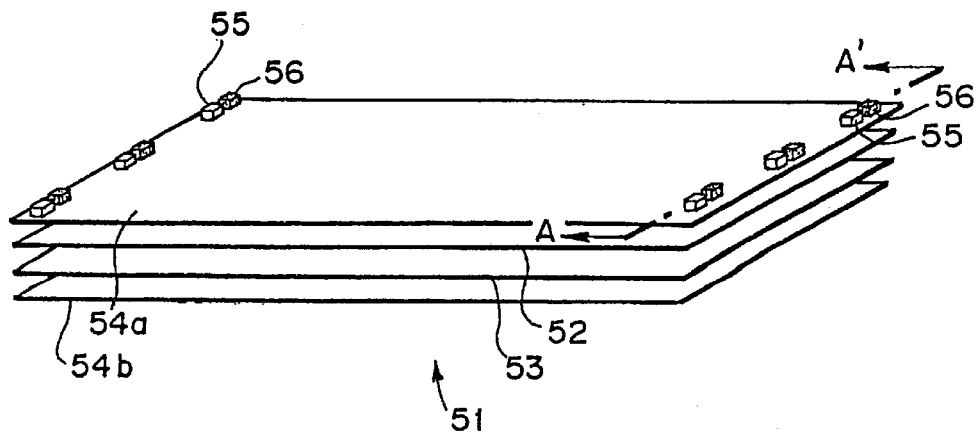

PRIOR ART

PRIOR ART

F I G. 26
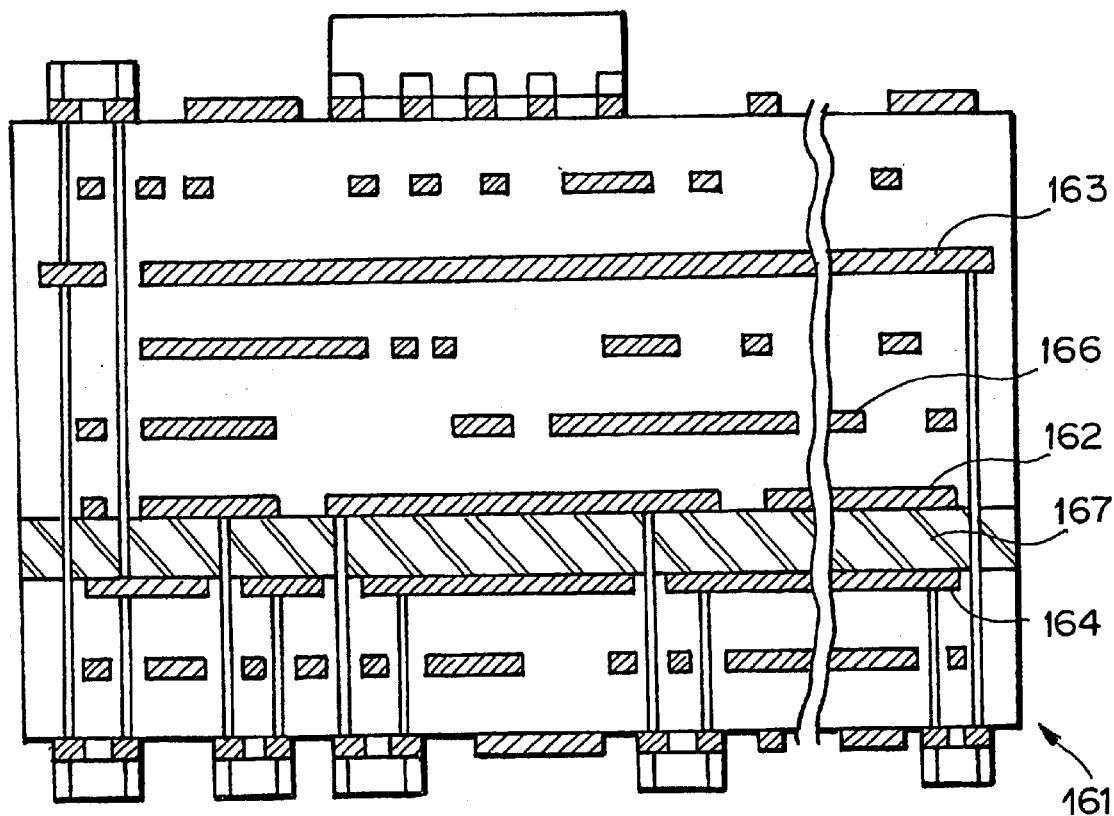
PRIOR ART

US 6,198,362 B1

PRINTED CIRCUIT BOARD WITH CAPACITORS CONNECTED BETWEEN GROUND LAYER AND POWER LAYER PATTERNS

BACKGROUND OF THE INVENTION

1. Field of the Invention

The present invention relates to a laminated printed circuit board that has at least two layers and that are used for electronic devices such as information processing devices and communicating devices, in particular, to a laminated printed circuit board having a function for suppressing an undesired electromagnetic wave from radiating.

2. Description of the Related Art

In advanced information society, undesired electromagnetic waves radiated from electronic devices such as information processing devices and communicating devices disturb broadcasting and radio communication systems and cause devices to malfunction. To suppress undesired electromagnetic waves from radiating and prevent them from entering such devices, shields and filters are used.

As a method for suppressing an undesired electromagnetic wave radiated from an electronic device, an electromagnetic wave radiated from a printed circuit board as a radiation source is enclosed with a shield. Alternatively, a printed circuit board is suppressed from radiating an electromagnetic wave.

For example, in a printed circuit board disclosed as Japanese Utility Model Registration Laid-Open Publication No. 05-13095, as shown in FIG. 20, a ground layer of a printed circuit board 101 is electrically connected to a cage 107 through a leaf spring 102 and a metal guide rail 103 so that the voltage of the ground layer is the same as the voltage of the cage 107. In this structure, the ground layer 104 functions as a metal plate so as to prevent electromagnetic noise from leaking out.

In an IC card disclosed as Japanese Patent Laid-Open Publication No. 07-192105, as shown in FIG. 21, a printed circuit board 113 and a metal panel 114 oppositely disposed with a frame 112 is electrically connected with a ground terminal 115 secured to the metal panel 114. Thus, the metal panel 114 effectively functions as a shield against external electrostatic induction and electromagnetic induction. Consequently, an IC chip 113 can be prevented from malfunctioning and breaking against interference of an undesired electromagnetic wave and radiation of static electricity.

In a liquid crystal displaying device 120 disclosed as Japanese Patent Laid-Open Publication No. 06-82803, as shown in FIG. 22, a metal plate 122 is electrically connected to a ground line of a printed circuit board 121. Thus, a ground line voltage is stably supplied. In addition, a liquid crystal displaying screen 124 and a metal frame 123 function as shields for suppressing an undesired electromagnetic wave from radiating.

As a main cause of which a printed circuit board radiates an undesired electromagnetic wave, a voltage between a ground for supplying a reference voltage and a power supply layer for supplying a power supply voltage to an IC and so forth fluctuates. In particular, when a system composed of a power supply layer and a ground layer resonates, an electromagnetic wave in very high level is radiated. To suppress a radiation due to the fluctuation of a power supply voltage, several structures of printed circuit boards have been proposed.

In a printed circuit board disclosed as Japanese Patent Laid-Open Publication No. 06-224562, as shown in FIG. 23, a part 131 of a power supply plane layer 133 is separated. The separated power supply plane layer 131 is disposed on a substrate 134 that is disposed adjacent to a ground plane layer 132. The power supply plane layer 131 separated from the power supply plane layer 133 is connected with a connecting means 135. Thus, the electrostatic capacity between the separated power supply plane layer 131 and the ground plane layer 132 increases.

In a laminated printed circuit board disclosed as Japanese Patent Laid-Open Publication No. 07-111387, as shown in FIG. 24, a power supply layer 141 and a ground layer 142 are laminated. A slit 143 is diagonally formed on a conductor of at least one of the power supply layer 141 and the ground layer 142.

In a printed circuit board 150 disclosed as Japanese Patent Laid-Open Publication No. 09-205290, as shown in FIG. 25, a power supply layer 151 and a ground layer 152 are disposed on a first surface and a second surface of the printed circuit board 150. At a peripheral portion of the first surface, fine conductor patterns 154 and 155 are alternately formed. At a peripheral portion of the second surface, fine conductor patterns 153 and 156 are alternately formed. The conductor patterns 154 are connected to the ground layer 152. The conductor patterns 155 are connected to the power supply layer 151. The conductor patterns 153 opposite to the conductor patterns 154 are connected to the power supply layer 151. The conductor patterns 156 opposite to the conductor patterns 155 are connected to the ground layer 152.

In a printed circuit board disclosed as Japanese Patent Laid-Open publication No. 09-283974, as shown in FIG. 26, a power supply layer 162 and a first ground layer 163 are oppositely disposed with a dielectric layer 166 and thereby a capacitor C1 is formed. A power supply layer 162 and a second ground layer 164 are oppositely disposed with a dielectric layer 167 and thereby a capacitor C2 is formed. In addition, the first ground layer 163 and the second ground layer 165 are connected through a resistor layer 166.

However, in the cage structure of the printed circuit board shown in FIG. 20, the printed board 101 and the cage 107 function as shields. Thus, when a substrate or a nonconductive cage made of plastic is used, it does not function as a shield. In this case, the cage structure cannot suppress an electromagnetic wave from radiating. In the IC card 111 shown in FIG. 21 and the liquid crystal displaying device shown in FIG. 22, since the printed circuit board requires a metal panel, the mounting density decreases and the fabrication cost increases.

In the printed circuit boards shown in FIGS. 23, 24, 25, and 26, they that are radiation sources suppress undesired electromagnetic waves from radiating. In these printed circuit boards, the voltage fluctuation between the ground for supplying a reference voltage and the power supply layer for supplying a power supply voltage is suppressed. However, in the printed circuit board 130 shown in FIG. 23, even if the power supply plane layer and part of the ground plane layer are adjacently disposed, the increase of the resultant electrostatic capacitance is very small. Thus, the fluctuation of the power supply voltage cannot be sufficiently suppressed. In the printed circuit board 140 shown in FIG. 24, since the slit 143 formed on the power supply layer 141 or/and the ground layer 142 function as slot antennas, the radiation of the electromagnetic waves further increases.

In the printed circuit board 150 shown in FIG. 25, since the polarity of the voltage generated between the conductor patterns 154 and 153 is reverse from the polarity of the voltage generated between the conductor patterns 155 and 156 adjacent to the conductor patterns 154 and 153, the voltages at the end portions of the printed circuit board are offset so as to suppress an electromagnetic wave from radiating. However, since the voltage fluctuation between the power supply layer 151 and the ground layer 152 still takes place, undesired electromagnetic waves radiated from the power supply layer 151 and the ground layer 152 cannot be suppressed. In the laminated printed circuit board 161 shown in FIG. 26, although the radiation of undesired electromagnetic waves and the malfunction of device due to the voltage fluctuation between the power supply and the ground are suppressed, another ground layer 164 and a second dielectric layer 167 should be additionally disposed along with the ground layer 163. Thus, the structure becomes complicated and the cost increases.

In the above-descried related art references, the structures of the printed circuit boards should be largely modified. Thus, to apply the technologies of the above-described related art references to printed circuit boards that are provided as products, they should be redesigned from the beginning.

The present invention is made from the above-described point of view. An object of the present invention is to provide a laminated printed circuit board that suppresses the voltage between a power supply and a ground from fluctuating and effectively suppresses an undesired electromagnetic wave from radiating without need to largely modify a circuit layout of a conventional printed circuit board.

SUMMARY OF THE INVENTION

A first aspect of the present invention is a printed circuit board having a metal layer, a dielectric layer, a ground layer, and a power supply layer, the metal layer and the dielectric layer being alternately laminated, the ground layer supplying a reference voltage, the power supply layer supplying a power supply voltage, the ground layer and the power supply layer being disposed as inner layers, comprising at least two belt-shaped planes formed on periphery of at least one of two surfaces of the layers of the printed circuit board, a plurality of viaholes for causing each of the belt-shaped planes to be connected to the ground layer and the power supply layer so that the voltages of the belt-shaped planes become the same, and a plurality of capacitors connected between the belt-shaped planes.

A plurality of capacitor resistor series circuits are disposed between the belt-shaped conductive loops.

A second aspect of the present invention is a printed circuit board having a metal layer, a dielectric layer, a ground layer, and a power supply layer, the metal layer and the dielectric layer being alternately laminated, the ground layer supplying a reference voltage, the power supply layer supplying a power supply voltage, the ground layer and the power supply layer being disposed as inner layers, comprising a plurality of conductor patterns formed at a part of or on the entire periphery of at least one of two surfaces of the layers of the printed circuit board, a plurality of viaholes for causing the conductor patterns to be alternately connected to the ground layer and the power supply layer, and a plurality of capacitors, disposed on the front surface of the conductor patterns, for connecting adjacent patterns of the conductor patterns.

A third aspect of the present invention is a printed circuit board having a metal layer, a dielectric layer, a ground layer, and a power supply layer, the metal layer and the dielectric layer being alternately laminated, the ground layer supplying a reference voltage, the power supply layer supplying a power supply voltage, the ground layer and the power supply layer being disposed as inner layers, comprising a plurality of conductor patterns formed at a part or on the entire periphery of at least one of two surfaces of the layers of the printed circuit board, a plurality of viaholes for causing the conductor patterns to be alternately connected to the ground layer and the power supply layer, and a plurality of capacitor resistor series circuits, disposed on the front surface of the conductor patterns, for connecting adjacent patterns of the conductor patterns.

A fourth aspect of the present invention is a printed circuit board having a metal layer, a dielectric layer, a ground layer, and a power supply layer, the metal layer and the dielectric layer being alternately laminated, the ground layer supplying a reference voltage, the power supply layer supplying a power supply voltage, the ground layer and the power supply layer being disposed as inner layers, comprising a plurality of pairs of pads connected to the power supply layer and the ground layer through viaholes on the periphery of the front surface of the printed circuit board or on the periphery of the power supply layer, and a plurality of resistor capacitor series circuits disposed between each pair of the pads, wherein the value of the resistor is set so that the value of parallel resistors on each side of the printed circuit board is equal to the characteristic impedance value assuming that the power supply layer and the ground layer are treated as parallel plate lines, the relevant sides being terminated.

Thus, according to a laminated printed circuit board of the present invention, at each end portion of the board, where the voltage between a ground layer and a power supply layer becomes maximum, a decoupling circuit that controls a resonance frequency and a circuit that has an electric loss are disposed. Thus, an undesired electromagnetic wave can be effectively suppressed without need to largely modify the structure of a conventional printed circuit board and the layout of circuits thereon.

These and other objects, features and advantages of the present invention will become more apparent in light of the following detailed description of a best mode embodiment thereof, as illustrated in the accompanying drawings

BRIEF DESCRIPTION OF DRAWINGS

FIG. 12 is an exploded perspective view showing the structure of a laminated printed circuit board according to a fourth embodiment of the present invention;

FIG. 13 is a sectional view taken along line A–A' shown in FIG. 12;

FIG. 14 is an exploded perspective view showing the structure of a laminated printed circuit board according to a fifth embodiment of the present invention;

FIG. 26 is a vertical sectional view showing the structure of a printed circuit board in consideration of suppressing an undesired electromagnetic wave from radiation according to another related art reference.

DESCRIPTION OF PREFERRED EMBODIMENTS

Next, with reference to the accompanying drawings, embodiments of the present invention will be described.

Figure 1:
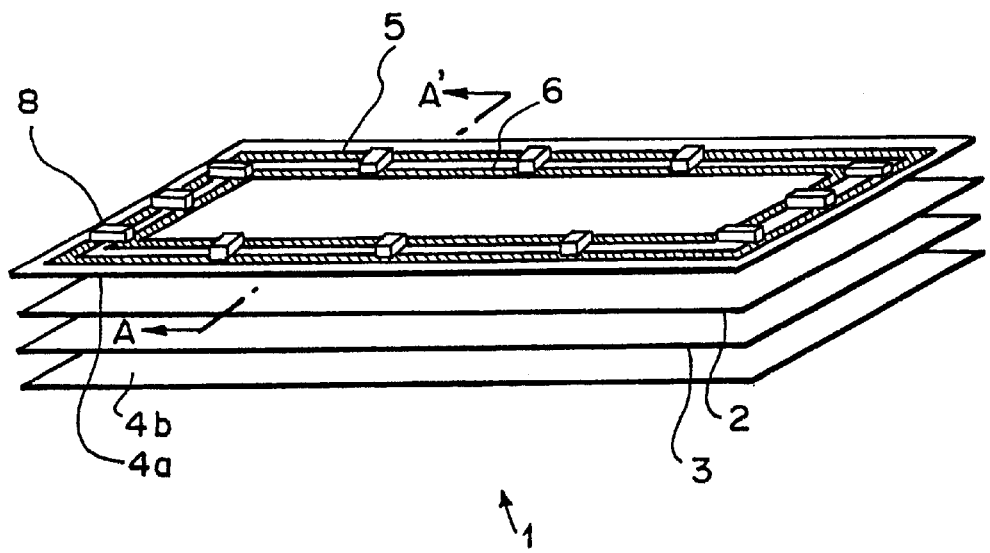
FIG. 1 is an exploded perspective view showing the structure of a laminated printed circuit board according to a first embodiment of the present invention.
Figure 2:
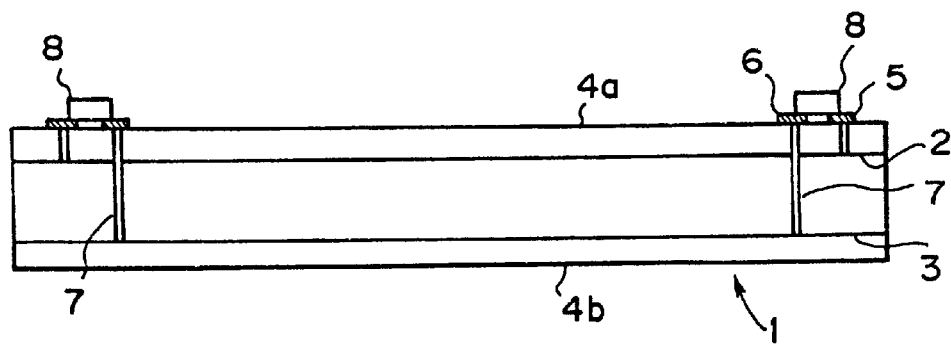
FIG. 2 is a sectional view taken along line A–A' shown in FIG. 1.

FIGS. 1 and 2 show the structure of a laminated printed circuit board 1 according to a first embodiment of the present invention. FIG. 1 is an exploded perspective view showing the structure of individual layers of the printed circuit board 1. FIG. 2 is a sectional view taken along the line A–A' shown in FIG. 1.

The printed circuit board 1 has four metal layers on which circuit patterns are formed by electrolytic plating method. Each layer is separated with an insulator (not shown) composed of such as glass epoxy or paper phenol. The four layers of the printed circuit board 1 are referred to as a first layer, a second layer, a third layer, and a fourth layer that are successively disposed from the top thereof. The first layer and the fourth layer are used as signal wiring layers 4a and 4b for wiring signal lines. The second layer is a ground layer 2. The third layer is a power supply layer 3. So-called solid patterns are formed on the entire surfaces of the ground layer 2 and the power supply layer 3.

The first layer 4a that is the top layer has two patterns 5 and 6 that form belt-shaped conductive patterns such as conductive loops on the periphery of the printed circuit board. The patterns 5 and 6 are connected to the power supply layer 3 and the ground layer 2 through viaholes formed at predetermined intervals, respectively. The pattern connected to the power supply layer 3 is referred to as top layer power supply pattern 6. The pattern connected to the ground layer is referred to as top layer ground pattern 5. Capacitors 8 are disposed at predetermined intervals between the top layer power supply pattern 6 and the top layer ground pattern 5 at predetermined intervals. The intervals of the viaholes that connect the inner patterns of the power supply layer 3 and the ground layer 2 and the top layer power supply pattern 6 and the top layer ground pattern 5 are preferably as small as possible. The maximum interval of adjacent viaholes 7 is preferably equal to or less than ½ of the wave length in the printed circuit board, the wave length being equivalent to the upper limit frequency in a frequency region for suppressing an undesired electromagnetic wave from radiating. This is because assuming that the power supply layer 3 and the top layer power supply pattern 6 or the ground layer 2 and the top layer ground pattern 5 are considered as transmission lines, at a frequency of which the interval of adjacent viaholes is ½ wave length, a resonance takes place due to a short circuit at both ends. Thus, an undesired electromagnetic wave in high level should be prevented from radiating. Assuming that the target frequency is in the range from 30 MHz to 1000 MHz as defined by VCCI (Voluntary Control Council for Interference by Information Technology Equipment) and that a printed circuit board composed of glass epoxy with a specific inductive capacity of around 5 is used, the maximum interval of adjacent viaholes becomes equal to or less than ½ of the wave length of the printed circuit board at the upper limit frequency of 1000 MHz. Thus, the maximum interval becomes around 67 mm or less.

Likewise, the interval of each capacitor 8 disposed between the top layer power supply pattern 6 and the top layer ground pattern 5 is preferably equal to or smaller than ½ of the wave length in the printed circuit board, the wave length being equivalent to the upper limit frequency in the frequency range, so as to suppress an undesired electromagnetic wave from radiating.

Next, with reference to the accompanying drawings, a mechanism for suppressing an undesired electromagnetic wave from radiating in the printed circuit board according to the first embodiment of the present invention will be described.

Figure 3:
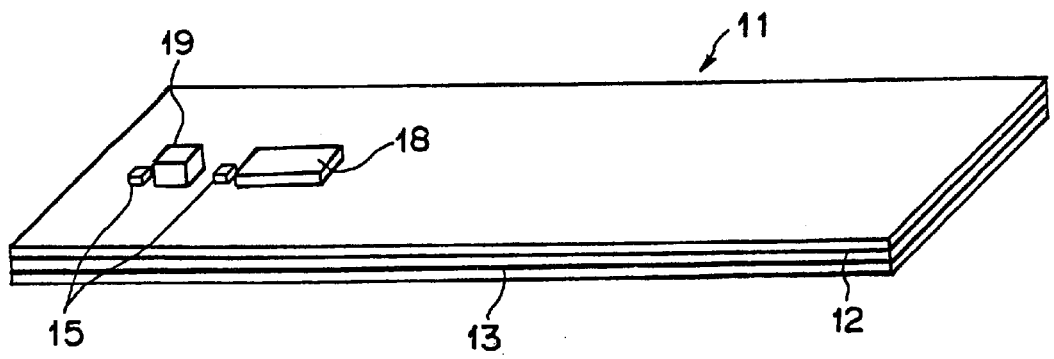
FIG. 3 is a perspective view showing the structure of a conventional laminated printed circuit board.

FIG. 3 shows the structure of a conventional printed circuit board 11. As described above, when a switching operation is performed in the printed circuit board that is a main radiation source, the power supply voltage fluctuates between a power supply layer and a ground layer. In the conventional printed circuit board 11 shown in FIG. 3, a power supply system composed of a power supply layer 13 and a ground layer 12 can be expressed as an equivalent circuit shown in FIG. 4 in such a manner that a decoupling circuit 14 is added to parallel plate lines 20 composed of the power supply layer 13 and the ground layer 12. The decoupling circuit 14 corresponds to a decoupling capacitor 15 disposed in the vicinity of a switching device such as an IC 18 or an oscillator 19. The decoupling circuit 14 can be expressed as a series circuit composed of a capacitance 16 of a capacitor and a parasitic inductance component 17 that resides in the capacitance 15, a viahole, a pad, and the like.

Figure 5:
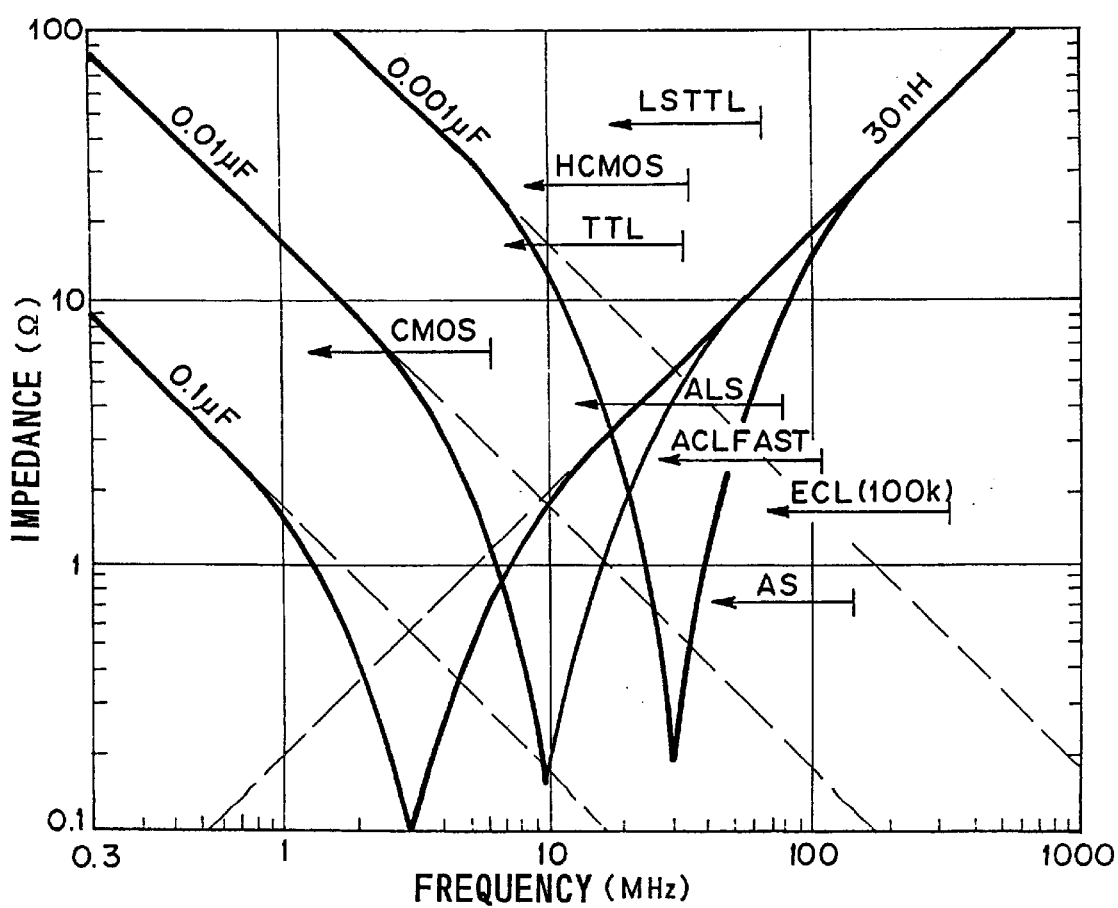
FIG. 5 is a graph showing a frequency characteristic of impedance of a decoupling circuit.

In the case that the decoupling circuit 14 operates as only the capacitance component 16, when a capacitor with sufficient capacitance is selected, the power supply voltage can be suppressed from fluctuating. However, in a real decoupling circuit, the parasitic inductance component 17 exists and it cannot be removed. FIG. 5 shows a frequency characteristic of impedance of a decoupling circuit having capacitors with different capacitance values and with parasitic inductance of 30 nH (refer to "Technical Report on Practically Suppressing Noise (translated title)" written by H. W. OTT, supervised by Deguchi, Jatech Shuppan, p. 313). In a frequency band higher than a resonance frequency, the impedance at both ends of the decoupling circuit becomes high due to an influence of parasitic inductance.

Figure 4:
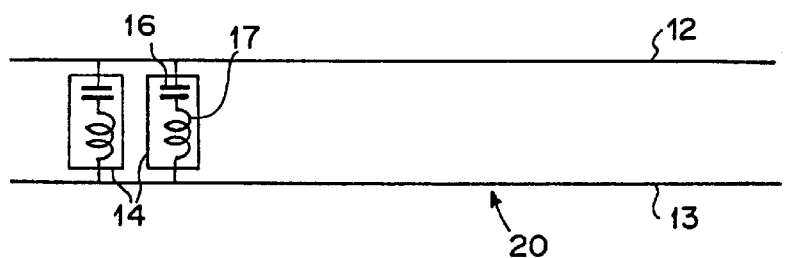
FIG. 4 is an equivalent circuit diagram showing a power supply system composed of a power supply plane and a ground plane of the conventional laminated printed circuit board shown in FIG. 3.
Figure 6:
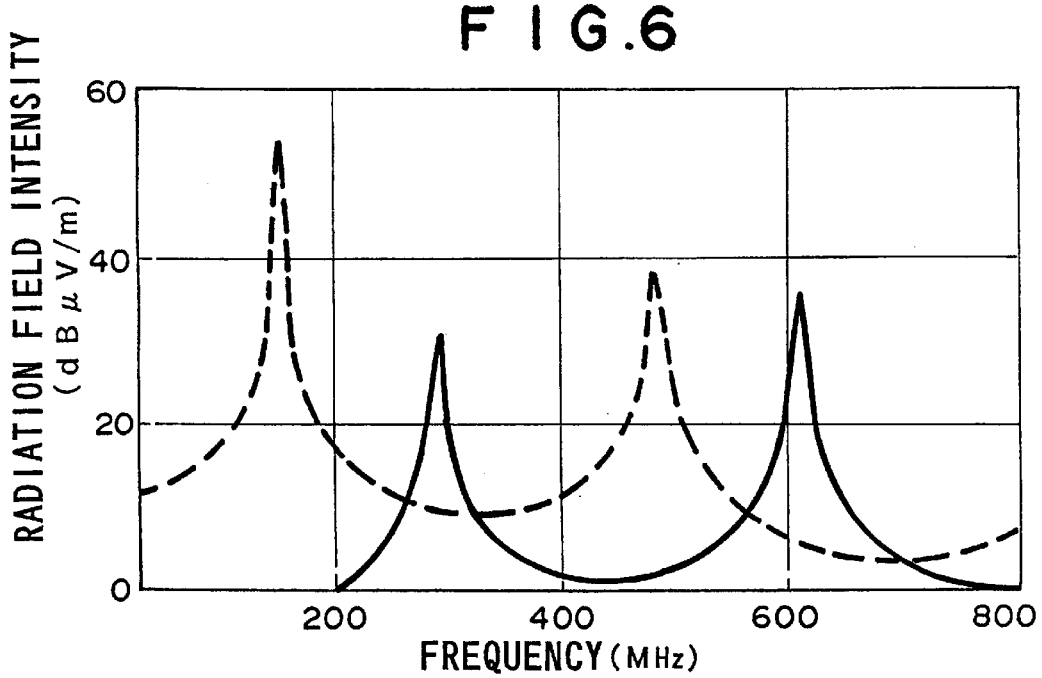
FIG. 6 is a graph showing a radiation characteristic of an undesired electromagnetic wave radiated from the printed circuit board according to the first embodiment of the present invention.

In the equivalent circuit shown in FIG. 4, the fluctuation of the power supply voltage due to a switching operation of an IC travels as a wave on the parallel plate lines. The wave reflects at each end as an open circuit. The reflected wave also reflects at the other end. The multiple reflections cause the parallel plate lines 20 to resonate at a predetermined frequency. The resonance results in radiating an undesired electromagnetic wave in high level. The resonance frequency depends on a characteristic impedance. The characteristic impedance depends on the constant of the decoupling circuit 14 and the size and structure of the transmission line. It is assumed that as shown in FIG. 3, each of the four layers of 100 (W) mm×160 (L) mm has one oscillator and one IC, each of which is connected to a 0.1 Ω decoupling capacitor. At this point, an undesired electromagnetic wave radiated from the power supply system composed of the power supply layer and the ground layer resonates at around 170 MHz and 480 MHz as denoted by peaks of a dotted curve shown in FIG. 6. In this frequency band, the resonance characteristic of the power supply system depends on the inductance component of the decoupling circuit. When the inductance component is decreased, the impedance between the power supply layer and the ground layer is decreased. Thus, an undesired electromagnetic wave radiated from the power supply system can be suppressed.

The parasitic inductance of the decoupling circuit can be decreased with the same decoupling circuit connected in parallel thereto. When n decoupling circuits with parasitic inductance L each are connected in parallel, the total inductance can be decreased to L/n. In other words, the parasitic inductance can be decreased by connecting the power supply layer and the ground layer with a plurality of viaholes and capacitors as with the printed circuit board 1 shown in FIG. 1. When this structure is formed at end portions of the printed circuit board, where that the end portions are treated as open ends assuming that the power supply layer and the ground layer that are parallel plate lines, a remarkable effect can be obtained.

In the printed circuit board 1 shown in FIG. 1, at each end portion thereof, the top layer power supply pattern 6 and the top layer ground pattern 5 are formed and connected to the power supply layer 3 and the ground layer 2 through three viaholes each, respectively. A radiation characteristic of an undesired electromagnetic wave of which both the patterns are connected with three 0.1 Ω capacitors is denoted by a solid curve shown in FIG. 6. This is a radiation characteristic of an undesired electromagnetic wave radiated from the printed circuit board due to the multiple reflections. In particular, at frequencies of 170 MHz and 480 MHz, the radiation of the undesired electromagnetic wave can be remarkably decreased.

As described above, to decrease the high frequency impedance between the power supply layer 3 and the ground layer 2, each capacitor 8 and each viahole 7 that connects the ground layer 2 and the power supply layer 3 to the top layer ground pattern 5 and the top layer power supply pattern 6 should be adjacently disposed with the minimum distance so as to minimize the influence of the parasitic inductance.

Figure 7:
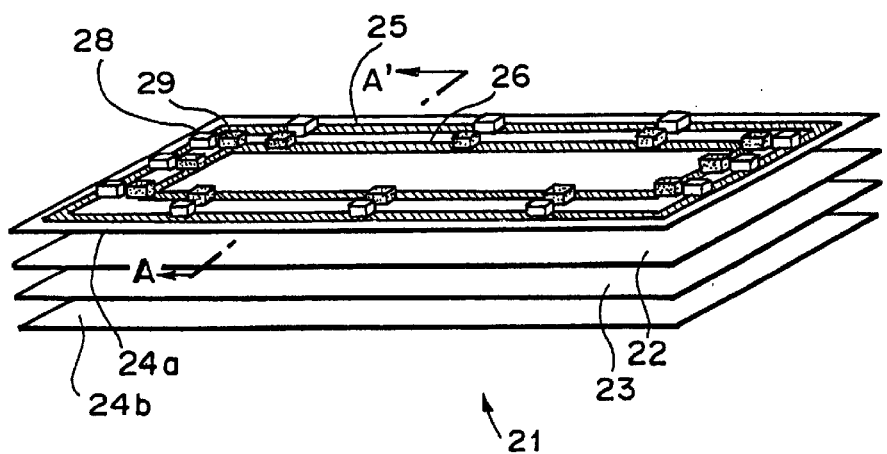
FIG. 7 is an exploded perspective view showing the structure of a laminated printed circuit board according to a second embodiment of the present invention.
Figure 8:
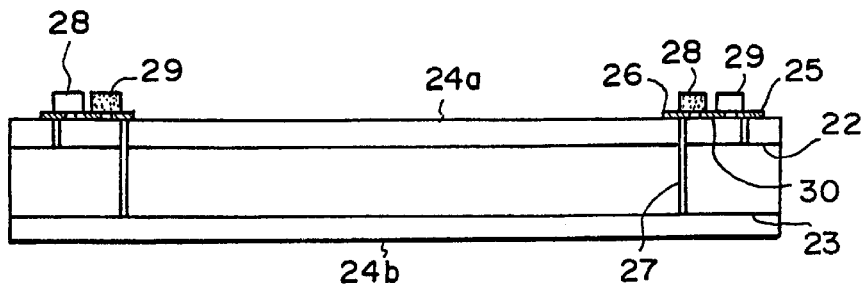
FIG. 8 is a sectional view taken along line A–A' shown in FIG. 7.

FIGS. 7 and 8 show the structure of a laminated printed circuit board 21 according to a second embodiment of the present invention. FIG. 7 is an exploded perspective view showing the printed circuit board 21. FIG. 8 is a sectional view taken along line A A' shown in FIG. 7.

The printed circuit board 21 has four metal layers on which circuit patterns are formed by electrolytic plating method. Each layer is separated with an insulator composed of such as glass epoxy or paper phenol. The four layers of the printed circuit board 21 are referred to as a first layer, a second layer, a third layer, and a fourth layer that are successively disposed from the top thereof. The first layer and the fourth layer are used as signal wiring layers 24 for wiring signal lines. The second layer is a ground layer 22. The third layer is a power supply layer 23. So-called solid patterns are formed on the entire surfaces of the ground layer 22 and the power supply layer 23.

On the periphery of the printed circuit board, a top layer power supply pattern 26 and a top layer ground pattern 25 that compose belt-shaped conductive patterns such as conductive loops connected to the power supply layer 23 and the ground layer 22 through a plurality of viaholes 27 are formed. A plurality of capacitor 28 resistor 29 series circuits are disposed at predetermined intervals between the top layer power supply pattern 26 and the top layer ground pattern 25. The capacitor 28 and the resistor 29 are connected through a pad 30 disposed between the top layer power supply pattern 26 and the top layer ground pattern 25.

The intervals of the viaholes that connect the inner patterns of the power supply layer 23 and the ground layer 22 and the top layer power supply pattern 26 and the top layer ground pattern 25 are preferably as small as possible. The maximum interval of adjacent viaholes 27 is preferably equal to or less than ½ of the wave length in the printed circuit board, the wave length being equivalent to the upper limit frequency in a frequency region for suppressing an undesired electromagnetic wave from radiating. Likewise, the interval of the capacitor 28 and the resistor 29 disposed between the top layer power supply pattern 26 and the top layer ground pattern 25 is preferably equal to or smaller than ½ of the wave length in the printed circuit board, the wave length being equivalent to the upper limit frequency in the frequency range, so as to suppress an undesired electromagnetic wave from radiating.

Next, a mechanism for suppressing an undesired electromagnetic wave from radiating in the printed circuit board according to the second embodiment of the present invention will be described.

Figure 9:
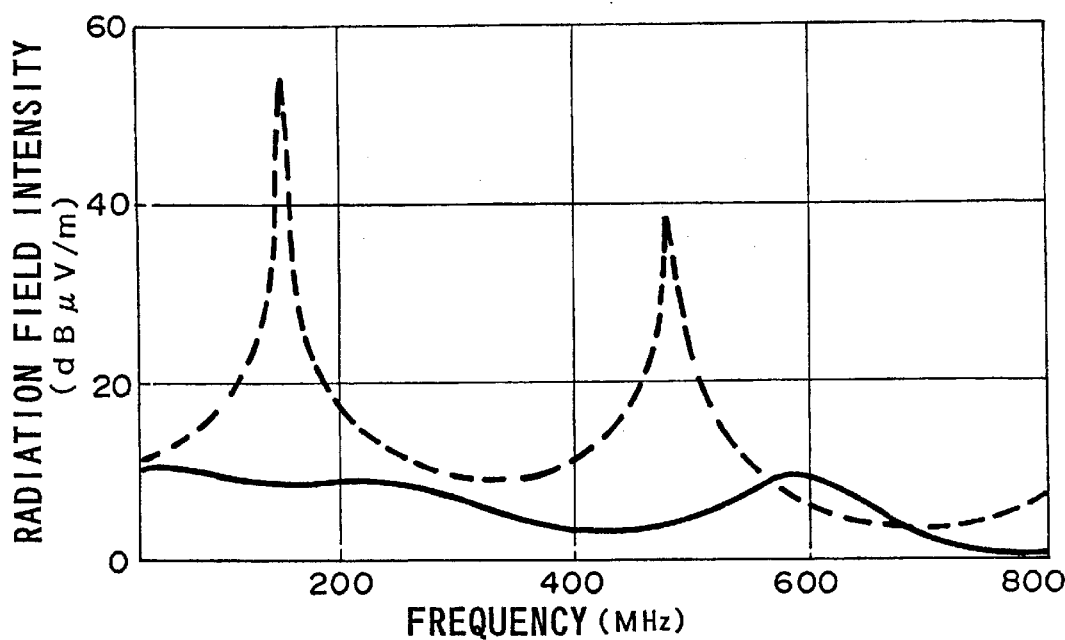
FIG. 9 is a graph showing a radiation characteristic of an undesired electromagnetic wave radiated from the printed circuit board according to the second embodiment of the present invention.

As described above (see FIG. 4), since the parallel plate lines as the power supply layer and the ground layer resonate, an electromagnetic wave in high level radiates due to the fluctuation of the power supply voltage of the laminated printed circuit board. Thus, to suppress an undesired electromagnetic wave in high level from radiating, with resistors disposed on the lines 20, the resonance Q should be decreased. The resistors are preferably disposed at end portions as open circuits of the lines. A solid curve shown in FIG. 9 represents a radiation characteristic of an undesired electromagnetic wave in the case that a top layer power supply pattern and a top layer ground pattern are formed at each end portion of the printed circuit board and connected to a power supply layer and a ground layer through three viaholes each, respectively, and that a series circuit of three 0.1 $\mu$F capacitors and one 6 $\Omega$ resistor is disposed between these patterns. In comparison with a radiation (denoted by a dotted curve shown in FIG. 9) of the conventional printed circuit board, an undesired electromagnetic wave is suppressed in most frequency bands ranging from 30 MHz to 800 MHz. Since the serial circuit of the resistor and the capacitors is disposed at each end portion of the printed circuit board, a DC current is suppressed from flowing between the power supply layer and the ground layer.

As described above, to decrease the high frequency impedance between the power supply layer 23 and the ground layer 22, each circuit of the capacitor 28 and the resistor 29 and each viahole 27 that connects the ground layer 22 and the power supply layer 23 to the top layer ground pattern 25 and the top layer power supply pattern 26 should be adjacently disposed with the minimum distance so as to minimize the influence of the parasitic inductance.

Figure 10:
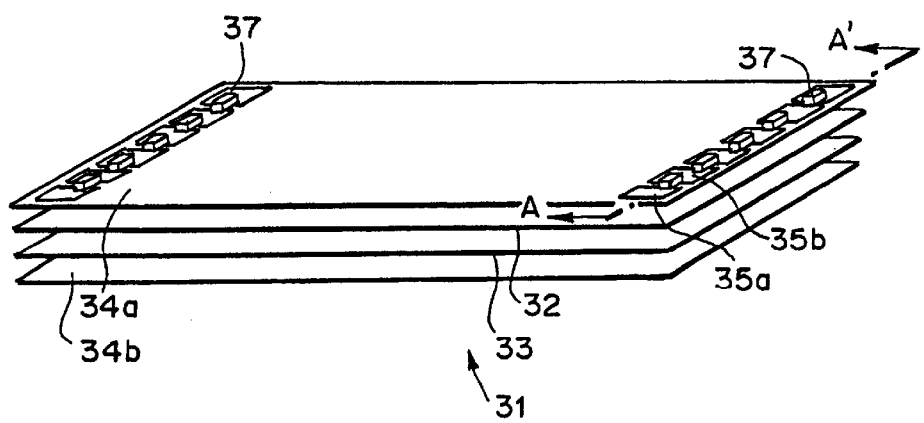
FIG. 10 is an exploded perspective view showing the structure of a laminated printed circuit board according to a third embodiment of the present invention.
Figure 11:
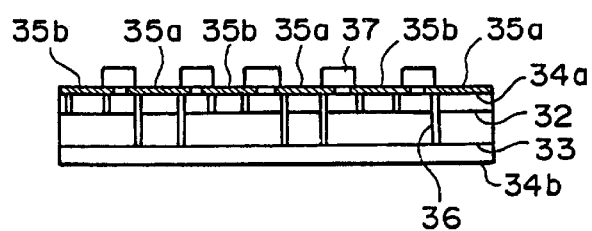
FIG. 11 is a sectional view taken along line A–A' shown in FIG. 10.

FIGS. 10 and 11 show the structure of a laminated printed circuit board 31 according to a third embodiment of the present invention. FIG. 10 is an exploded perspective view of the printed circuit board 31. FIG. 11 is a sectional view taken along line A A' shown in FIG. 10.

The printed circuit board 31 has four metal layers on which circuit patterns are formed by electrolytic plating method. Each layer is separated with an insulator composed of such as glass epoxy or paper phenol. The four layers of the printed circuit board 31 are referred to as a first layer, a second layer, a third layer, and a fourth layer that are successively disposed from the top thereof. The first layer and the fourth layer are used as signal wiring layers 34 for wiring signal lines. The second layer is a ground layer 32. The third layer is a power supply layer 33. So-called solid patterns are formed on the entire surfaces of the ground layer 32 and the power supply layer 33.

On the first layer 34a as the top layer, a plurality of conductor patterns 35a and a plurality of conductor patterns 35b are alternately formed on opposite end portions of the printed circuit board 31. The conductor patterns 35a are connected to the power supply layer 33 through viaholes 36. The conductor patterns 35b are connected to the ground layer 32 through the viaholes 36. The adjacent conductor patterns 35a and 35b are connected in high frequency through capacitors 37.

As the theory for suppressing an undesired electromagnetic wave from radiating in a power supply system of the printed circuit board 31, a plurality of conductor patterns connected to the power supply layer 33 and the ground layer 32 are formed. The conductor patterns are connected with the capacitors 37. Thus, the parasitic inductance can be decreased. Consequently, to decrease the parasitic inductance, each capacitor 37 and each viahole 36 that connects the conductor patterns 35a and 35b, the power supply layer 33, and the ground layer 32 should be adjacently disposed.

FIGS. 12 and 13 show the structure of a laminated printed circuit board 41 according to a forth embodiment of the present invention. FIG. 12 is an exploded perspective view of the printed circuit board 41. FIG. 13 is a sectional view taken along line A A' shown in FIG. 12.

The printed circuit board 41 has four metal layers on which circuit patterns are formed by electrolytic plating method. Each layer is separated with an insulator composed of such as glass epoxy or paper phenol. The four layers of the printed circuit board 41 are referred to as a first layer, a second layer, a third layer, and a fourth layer that are successively disposed from the top thereof. The first layer and the fourth layer are used as signal wiring layers 44 for wiring signal lines. The second layer is a ground layer 42. The third layer is a power supply layer 43. So-called solid patterns are formed on the entire surfaces of the ground layer 42 and the power supply layer 43.

On the first layer 44a as the top layer, a conductor pattern 45a and a conductor pattern 45b are alternately formed on opposite end portions of the printed circuit board 41. The conductor pattern 45a is connected to the power supply layer 43 at a part or on the entire periphery thereof through viaholes 46. The conductor pattern 45b is connected to the ground layer 42 at a part or on the entire periphery thereof through the viaholes 46. The adjacent conductor patterns 45a and 45b are connected in high frequency through a plurality of capacitor 47 resistor 48 serial circuits. The capacitor 47 and the resistor 48 are connected through a pad 49.

As the theory for suppressing an undesired electromagnetic wave from radiating in a power supply system of the printed circuit board 41, the resistors 48 are connected between the conductor pattern 45a connected to the power supply layer 43 and the conductor pattern 45b connected to the ground layer 42 through the capacitors 47. Due to the loss of the resistors 48, assuming that the power supply layer and the ground layer are treated as transmission lines, the resonance Q can be decreased. When a plurality of conductor patterns 45a and a plurality of conductor patterns 45b are formed, the parasitic inductance can be decreased. Thus, the effect for suppressing an undesired electromagnetic wave from radiating is improved. Consequently, to decrease the parasitic inductance, each circuit of the capacitor 47 and the resistor 48 and each viahole 46 that connects the conductor patterns 45a and 45b, the power supply layer 43, and the ground layer 42 should be adjacently disposed.

Figure 15:
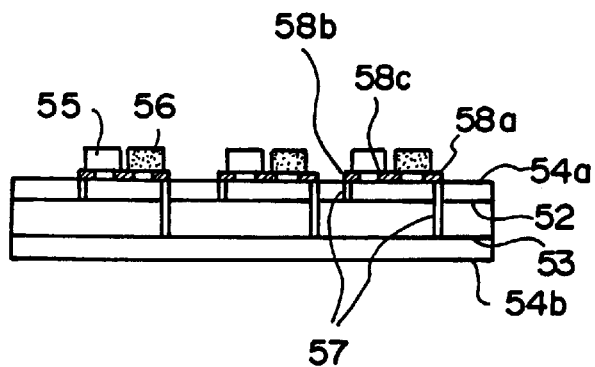
FIG. 15 is a sectional view taken along line A–A' shown in FIG. 14.

FIGS. 14 and 15 show the structure of a printed circuit board 51 according to a fifth embodiment of the present invention. FIG. 14 is an exploded perspective view of the printed circuit board 51. FIG. 15 is a sectional view taken along line A–A' shown in FIG. 14.

The printed circuit board 51 has four metal layers on which circuit patterns are formed by electrolytic plating method. Each layer is separated with an insulator composed of such as glass epoxy or paper phenol. The four layers of the printed circuit board 51 arc referred to as a first layer, a second layer, a third layer, and a fourth layer that are successively disposed from the top thereof. The first layer and the fourth layer are used as signal wiring layers 54a and 54b for wiring signal lines. The second layer is a ground layer 52. The third layer is a power supply layer 53. So-called solid patterns are formed on the entire surfaces of the ground layer 52 and the power supply layer 53.

On the signal wiring layer 54a as the top layer, a plurality of pairs of pads 58a and 58b are disposed at opposite end portions of the printed circuit board 51 or at end portions of the power supply layer 53. The pairs of the pads 58a and 58b are connected to the power supply layer 53 and the ground layer 52 through viaholes. A series circuit of resistor 56 and capacitor 55 is disposed between each pair of pads 58a and 58b. The resistor 56 and the capacitor 57 are connected with a pad 58c disposed between the pair of pads 58a and 58b. The resistance of the resistor 56 is set so that the resistance value of the parallel resistors disposed on one side of the printed circuit board 51 is equal to the characteristic impedance assuming that the power supply layer 53 and the ground layer 52 are treated as parallel plate lines.

Next, a mechanism for suppressing an undesired electromagnetic wave from radiating in the printed circuit board according to the fifth embodiment of the present invention will be described.

Figure 16:
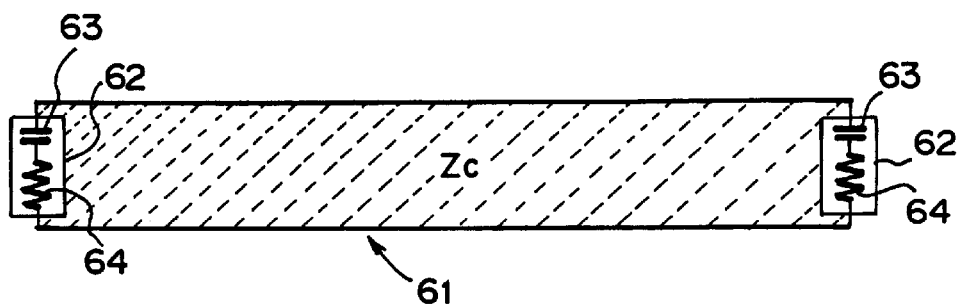
FIG. 16 is an equivalent circuit diagram showing the theory according to the fifth embodiment of the present invention.

As described above, in the conventional printed circuit board 11 shown in FIG. 3, a power supply system composed of a power supply layer 13 and a ground layer 12 can be expressed as an equivalent circuit shown in FIG. 4 in such a manner that a decoupling circuit 14 is added to parallel plate lines 20 composed of the power supply layer 13 and the ground layer 12. When a resonance takes place between the lines, the power supply system radiates an undesired electromagnetic wave in very high level. To suppress the resonance, as expressed with an equivalent circuit shown in FIG. 16, the lines are terminated with a terminating circuit 62 with resistance R that is equal to characteristic impedance Zc of the lines assuming that the power supply layer 53 and the ground layer 52 are treated as parallel plate lines 62. To prevent a DC current from flowing between the power supply and the ground, the terminating circuit 62 may be composed of a capacitor 63 and resistor 64 series circuit.

Figure 17:
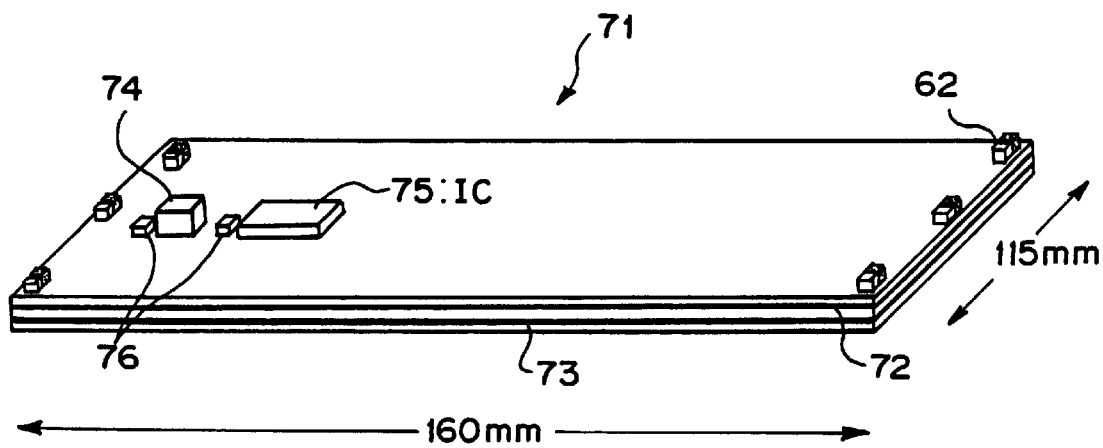
FIG. 17 is a perspective view showing the structure of the laminated printed circuit board according to the fifth embodiment of the present invention.
Figure 18:
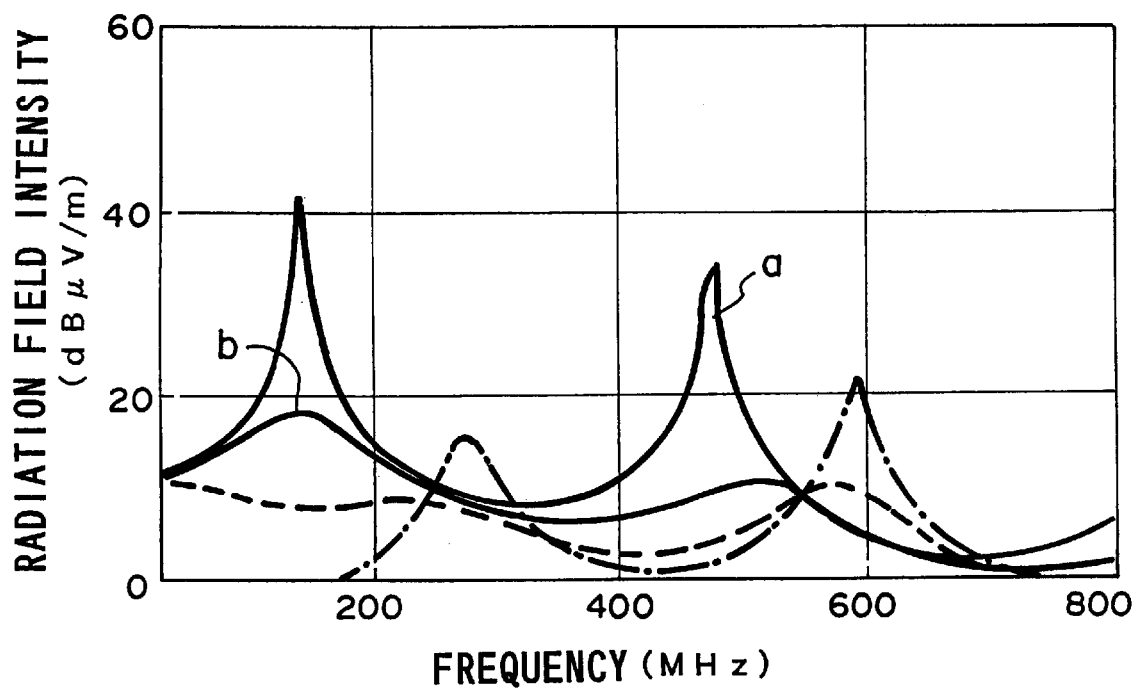
FIG. 18 is a graph showing an undesired electromagnetic wave suppressing effect according to the fifth embodiment of the present invention.

FIG. 17 shows a four-layered printed circuit board 71 with a size of 115 mm (W)×160 mm (L). The thickness between a power supply layer 73 and a ground layer 72 is 1 mm. The printed circuit board 71 has an oscillator 74, an IC 75, and a decoupling capacitor 76. FIG. 18 shows a resistance dependency of a terminating circuit against a radiation characteristic of an undesired electromagnetic wave radiated from the power supply system of the printed circuit board 71. At each end portion of the printed circuit board 71, three terminating circuits 62 are disposed in parallel. The resistance values of the three terminating circuits 62 are 10 Ω (parallel resistance value: 3.3 Ω), 5 Ω (parallel resistance value: 1.7 Ω, and 1 Ω (parallel resistance value: 0.3 Ω). The capacitance value of each capacitor is 0.1 $\mu$F. Assuming that the specific inductive capacity is 4.8, the characteristic impedance of the parallel plate lines composed of the power supply layer 73 and the ground layer 72 is around 1.5 Ω. The radiation characteristic in the case that a terminating circuit is not disposed is denoted by a solid curve (a) shown in FIG. 18. The radiation characteristic in the case that a terminating circuit with a resistor of 10•is denoted by a curve (b) shown in FIG. 18. The radiation characteristic in the case that a terminating circuit with a resistor of 5•is denoted by a dashed curve shown in FIG. 18. The radiation characteristic in the case that a terminating circuit with a resistor of 1•is denoted by a dotted line shown in FIG. 18. In the entire frequency bands, the radiation level in the case that a terminating circuit with a resistor of 5•that is close to the characteristic impedance Zc of the parallel plate lines is the lowest. When a terminating circuit with another resistor is used, the radiation level decreases in comparison with the case that no terminating circuit is used. However, in consideration of optimization, the impedance should be matched as a major factor.

In such a structure, to reduce the influence of parasitic inductance of capacitors, resistors, and viaholes, three terminating circuits are disposed in parallel at each end portion of the printed circuit board.

Since the three terminating circuits are disposed in parallel at each end portion of the printed circuit board, the influence of parasitic inductance of the capacitors, resistors, and viaholes can be reduced.

Figure 19:
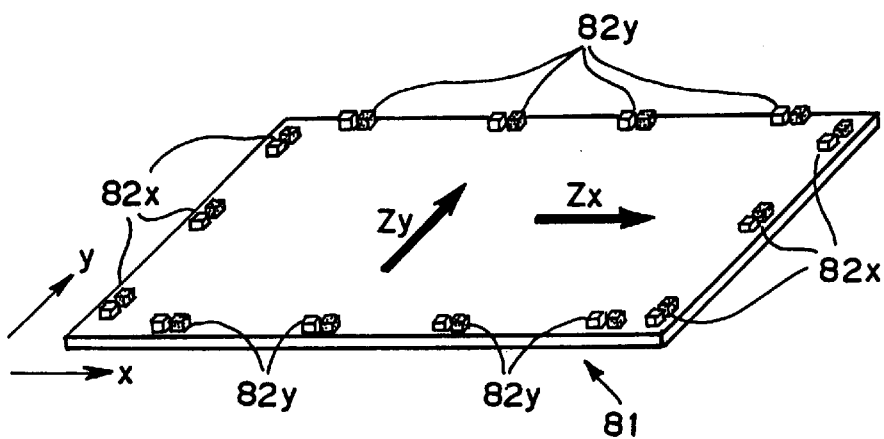
FIG. 19 is a perspective view showing the structure of a laminated printed circuit board according to a modification of the fifth embodiment of the present invention.
Figure 20:
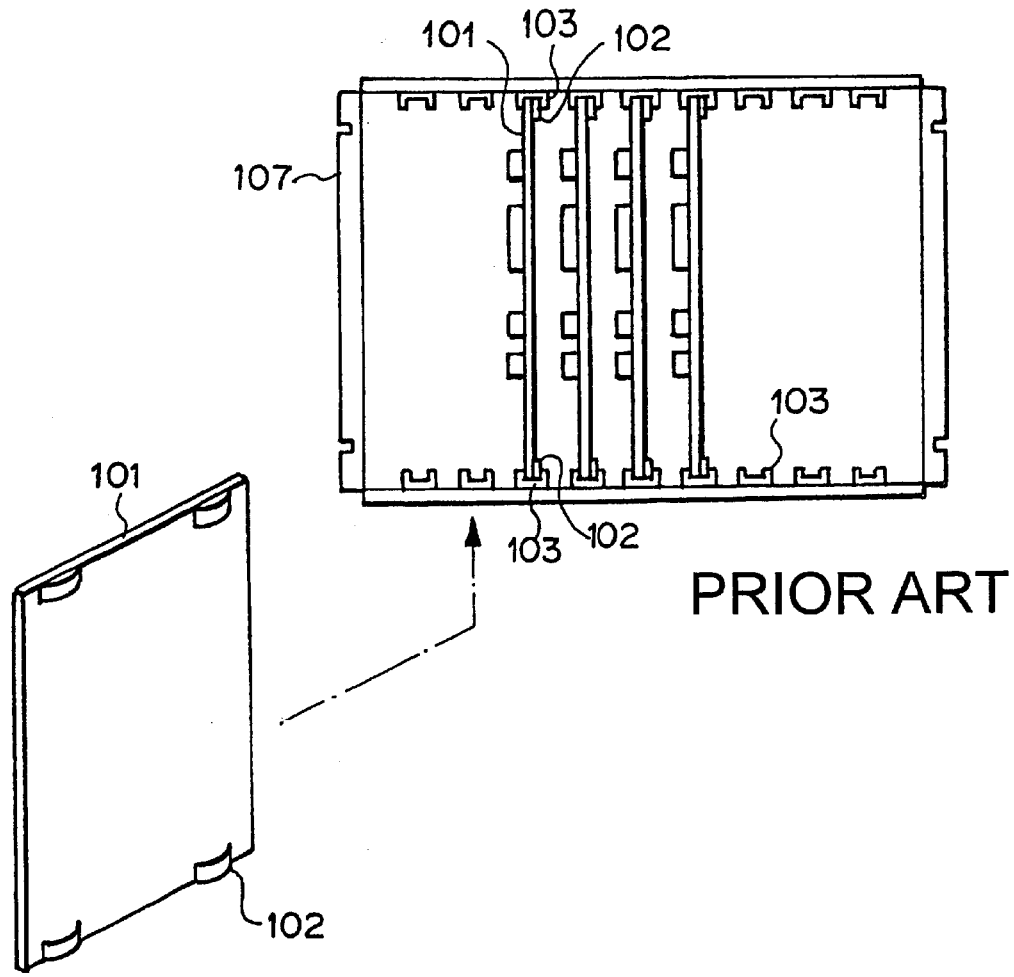
FIG. 20 is a schematic diagram for explaining a printed circuit board in consideration of suppressing an undesired electromagnetic wave from radiating according to a related art reference.
Figure 21:
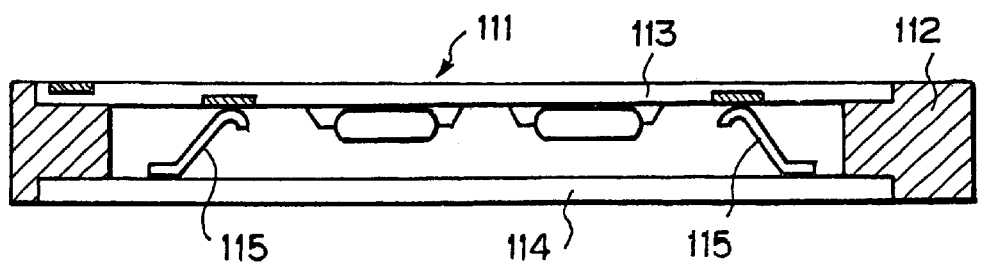
FIG. 21 is a sectional view taken from line A–A' shown in FIG. 20.
Figure 22:
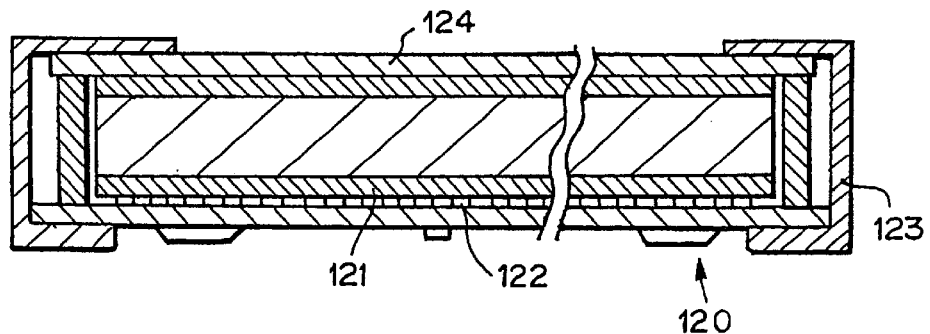
FIG. 22 is a sectional view showing the structure of another printed circuit board in consideration of suppressing an undesired electromagnetic wave from radiating according to another related art reference.
Figure 23:
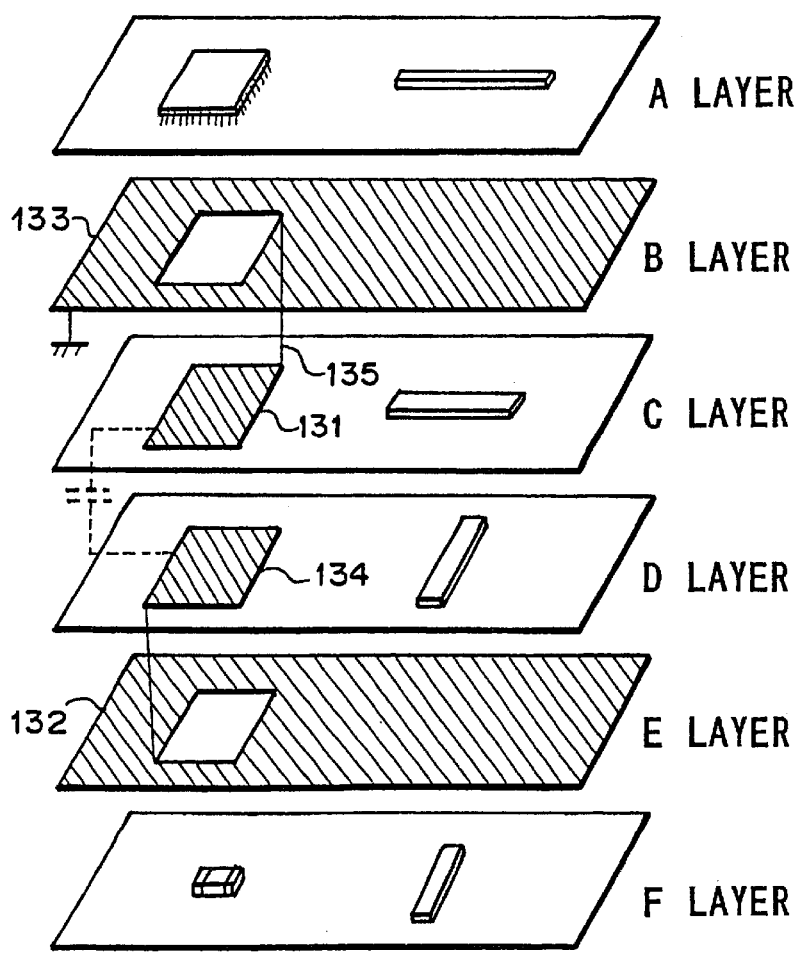
FIG. 23 is an exploded sectional view showing the structure of another printed circuit board in consideration of suppressing an undesired electromagnetic wave from radiating according to another related art reference.
Figure 24:
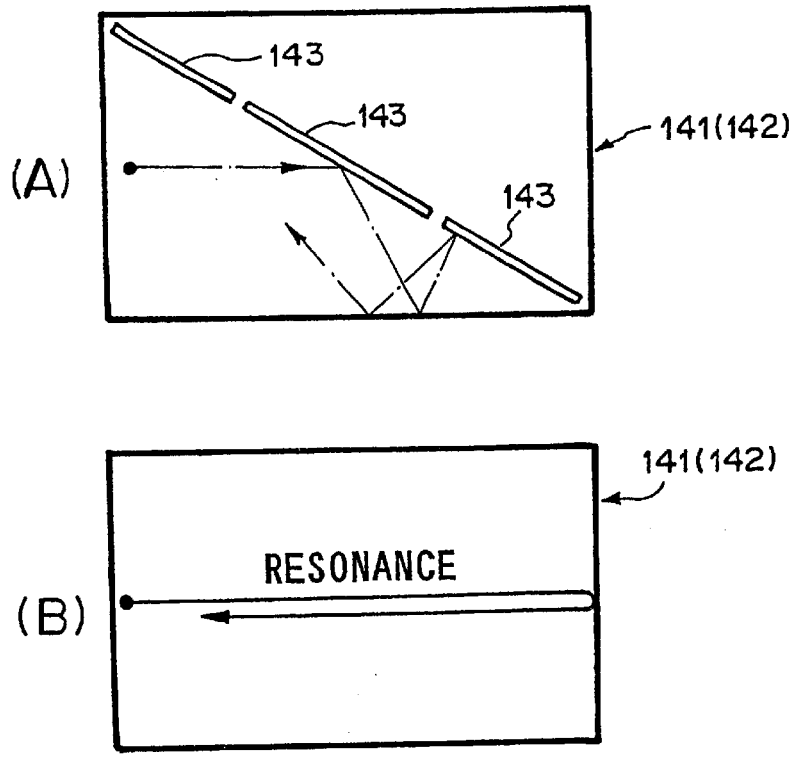
FIG. 24A is a side view showing the structure of a printed circuit board in consideration of suppressing an undesired electromagnetic wave from radiating according to a related art reference.
FIG. 24B is a plan view of FIG. 24A.
Figure 25:
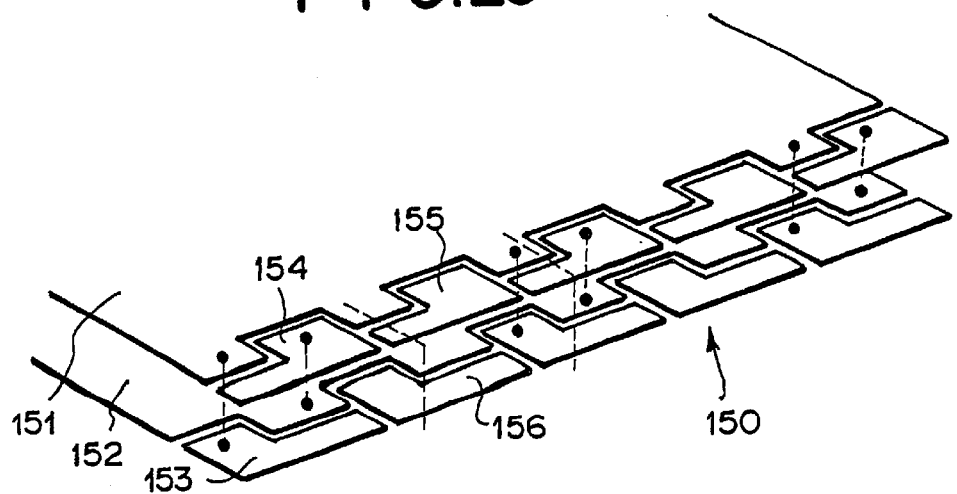
FIG. 25 is a partial sectional view showing the structure of another printed circuit board in consideration of suppressing an undesired electromagnetic wave from radiating according to another related art reference.

When the shape of a printed circuit board 81 is almost square as shown in FIG. 19, it is necessary to consider two traveling directions x and y of radio waves. In this case, terminating circuits having parallel resistance values that are equal to characteristic impedance values Zx and Zy of parallel plate lines in the traveling directions of radio waves are disposed at end portions in the traveling directions of radio waves.

When there are a plurality of power supply layers for supplying different voltages to circuits, the above-described terminating circuits are disposed on each power supply plane.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A printed circuit board having at least one wiring layer, a dielectric layer, a ground layer, and a power supply layer, the at least one wiring layer and the dielectric layer being alternately laminated, the ground layer supplying a reference voltage, the power supply layer supplying a power supply voltage, the ground layer and the power supply layer being disposed as inner layers, comprising:
   at least two separate conductive loops disposed along a periphery of at least one of two surfaces of the layers of the printed circuit board;
   a plurality of vias connecting each of said conductive loops to one of the ground layer and the power supply layer; and
   a plurality of capacitors connected between said separate conductive loops.

2. The printed circuit board as set forth in claim 1, wherein each of the plurality of capacitors is connected in series with a resistor.

3. The printed circuit board of claim 1, wherein one of the conductive loops is disposed entirely within another of the conductive loops.

4. The printed circuit board of claim 1, wherein the at least two separate conductive loops are disposed on a single plane.

5. The printed circuit board of claim 4, wherein said single plane is coplanar with one of the at least one wiring layers.

6. The printed circuit board of claim 5, wherein one of the conductive loops is disposed entirely within another of the conductive loops.

7. The printed circuit board of claim 6, wherein each of the capacitors connected between adjacent said conductive loops is arranged in series with a resistor.

8. The printed circuit board of claim 6, wherein there are no more than two said conductive loops coplanar with each of said at least one wiring layer.

9. The printed circuit board of claim 8, wherein each of the capacitors connected between adjacent said conductive loops is arranged in series with a resistor.

10. A printed circuit board having at least one wiring layer, a dielectric layer, a ground layer, and a power supply layer, the at least one wiring layer and the dielectric layer being alternately laminated, the ground layer supplying a reference voltage, the a power supply layer supplying a power supply voltage, the ground layer and the power supply layer being disposed as inner layers, comprising:

- at least three adjacent conductor patterns formed in a line along at least one edge of at least one of the layers of the printed circuit board; and
- a plurality of vias connecting each of the conductor patterns to one of the ground layer and the power supply layer, each said line of conductor patterns being arranged so that the via connections alternate between the ground layer and the power supply layer in successive said conductor patterns;
- wherein each of the conductor patterns within each said line of conductor patterns is connected to each adjacent said conductor pattern by a capacitor.

11. The printed circuit board of claim 10, wherein each of the conductor patterns within each said line of conductor patterns is connected to each adjacent said conductor pattern by a series arrangement of a resistor and the capacitor.

12. The printed circuit board of claim 11, wherein at least one said line of conductor patterns is disposed along substantially an entire said edge of the printed circuit board.

13. The printed circuit board of claim 12, wherein each of the conductor patterns is connected to one of the ground plane and the power supply plane by a plurality of said vias.

14. The printed circuit board of claim 10, wherein at least one said line of conductor patterns is disposed along substantially an entire said edge of the printed circuit board.

15. The printed circuit board of claim 14, wherein each of the conductor patterns is connected to one of the ground plane and the power supply plane by a plurality of said vias.

16. A printed circuit board having at least one wiring layer, a dielectric layer, a ground layer, and a power supply layer, the at least one wiring layer and the dielectric layer being alternately laminated, the ground layer supplying a reference voltage, the power supply layer supplying a power supply voltage, the ground layer and the power supply layer being disposed as inner layers, comprising:

- at least two separate belt-shaped conductive patterns disposed along a periphery of at least one of two surfaces of the layers of the printed circuit board;
- a plurality of vias connecting each of said separate belt-shaped conductive patterns to one of the ground layer and the power supply layer; and
- a plurality of capacitors connected between said separate belt-shaped conductive patterns.

17. The printed circuit board as set forth in claim 16, wherein each of the plurality of capacitors is connected in series with a resistor.

18. The printed circuit board as set forth in claim 16, wherein the at least two separate belt-shaped conductive patterns are disposed on a single plane.

19. The printed circuit board as set forth in claim 18, wherein said single plane is coplanar with one of the at least one wiring layers.

* * * * *